US009879341B2

(12) United States Patent
Singh et al.

(10) Patent No.: US 9,879,341 B2
(45) Date of Patent: Jan. 30, 2018

(54) METHOD AND APPARATUS FOR MICROWAVE ASSISTED CHALCOGEN RADICALS GENERATION FOR 2-D MATERIALS

(71) Applicant: Applied Materials, Inc., Santa Clara, CA (US)

(72) Inventors: Kaushal K. Singh, Santa Clara, CA (US); Deepak Jadhav, Hubli (IN); Ashutosh Agarwal, Jaipur (IN); Ashish Goel, Bangalore (IN); Vijay Parihar, Fremont, CA (US); Er-Xuan Ping, Fremont, CA (US); Randhir P. S. Thakur, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 18 days.

(21) Appl. No.: 15/188,103

(22) Filed: Jun. 21, 2016

(65) Prior Publication Data
US 2016/0372351 A1    Dec. 22, 2016

(30) Foreign Application Priority Data
Jun. 22, 2015    (IN) .......................... 3110/CHE/2015

(51) Int. Cl.
| *H01L 21/67* | (2006.01) |
| *H01L 21/02* | (2006.01) |
| *C23C 16/54* | (2006.01) |
| *C23C 14/56* | (2006.01) |
| *C23C 16/455* | (2006.01) |

(52) U.S. Cl.
CPC .... *C23C 16/45525* (2013.01); *H01L 21/0217* (2013.01); *H01L 21/0262* (2013.01); *H01L 21/02181* (2013.01); *H01L 21/02381* (2013.01); *H01L 21/02568* (2013.01); *H01L 21/02658* (2013.01); *H01L 21/6719* (2013.01); *H01L 21/6723* (2013.01); *H01L 21/67167* (2013.01); *C23C 14/56* (2013.01); *C23C 16/54* (2013.01)

(58) Field of Classification Search
CPC ...... H01L 21/6719; H01L 21/67207–21/6723; H01L 21/67161–21/67167; C23C 14/56; C23C 14/568; C23C 16/54
See application file for complete search history.

(56) References Cited

U.S. PATENT DOCUMENTS

| 5,628,828 A * | 5/1997 | Kawamura ......... C23C 16/4412 118/719 |
| 2007/0017445 A1* | 1/2007 | Takehara .............. C23C 14/568 118/719 |
| 2007/0020890 A1* | 1/2007 | Thakur ............. H01L 21/67184 438/478 |
| 2007/0020903 A1* | 1/2007 | Takehara .............. C23C 14/568 438/592 |

(Continued)

*Primary Examiner* — Marvin Payen
*Assistant Examiner* — Jeremy Joy
(74) *Attorney, Agent, or Firm* — Patterson + Sheridan LLP

(57) ABSTRACT

Embodiments described herein provide a remote plasma system utilizing a microwave source. Additionally, generation and deposition techniques for 2D transition metal chalcogenides with large area uniformity utilizing microwave assisted generation of radicals is disclosed. Plasma may be generated remotely utilizing the microwave source. A processing platform configured to deposit 2D transition metal chalcogenides is also disclosed.

20 Claims, 3 Drawing Sheets

(56) References Cited

U.S. PATENT DOCUMENTS

| | | | |
|---|---|---|---|
| 2010/0304027 A1* | 12/2010 | Lee | C23C 14/564 |
| | | | 427/255.39 |
| 2011/0097878 A1* | 4/2011 | Olgado | C23C 16/4587 |
| | | | 438/478 |
| 2015/0111392 A1* | 4/2015 | Ishii | H01L 21/02551 |
| | | | 438/758 |
| 2017/0250075 A1* | 8/2017 | Caymax | H01L 21/02568 |

* cited by examiner

METHOD AND APPARATUS FOR MICROWAVE ASSISTED CHALCOGEN RADICALS GENERATION FOR 2-D MATERIALS

CROSS-REFERENCE TO RELATED APPLICATIONS

This application claims benefit to Indian Provisional Patent Application No. 3110/CHE/2015, filed Jun. 22, 2015, the entirety of which is hereby incorporated by reference.

BACKGROUND

Field

Embodiments of the present disclosure generally relate to the fabrication of semiconductor and other electronic devices and methods for generating and forming a film on a substrate. More particularly, the present disclosure relates to a fabrication process for forming multiple layers on a substrate including a chalcogenide film layer.

Description of the Related Art

Reliably producing submicron and smaller features is one of the key technologies for the next generation of very large scale integration (VLSI) and ultra large scale integration (ULSI) of semiconductor devices. However, as the miniaturization of circuit technology is desired, reduced dimensions of interconnects in VLSI and ULSI technology has placed additional demands on processing capabilities. The multilevel interconnects that lie at the center of this technology require precise processing of high aspect ratio features, such as vias and other interconnects. Reliable formation of these interconnects is essential to VLSI and ULSI success and to the continued effort to increase circuit density and the overall quality of individual substrates.

Additionally, as circuit densities increase for next generation devices, the widths of interconnects, such as vias, trenches, contacts, gate structures, and other features, as well as the dielectric materials therebetween, decrease in dimension. However, the thickness of the dielectric layers may remain substantially constant. As such, an increase in the aspect ratio of the features results.

Furthermore, in the fabrication of integrated circuits, deposition processes such as chemical vapor deposition (CVD), atomic layer deposition (ALD), or plasma enhanced chemical vapor deposition (PECVD) processes are used to deposit films of various materials upon semiconductor substrates. Further reductions in device dimensions will require precise control over different aspects of the deposition processes, such as gas distribution uniformity, the generation of reacting species using microwave plasma energy, concentration uniformity, and control of the amount of gases provided to the surface of the substrate for two-dimensional (2D) films having a thickness less than one nanometer. Thus, there is a continuing need for an improved process platform to further enhance the control over different aspects of these deposition processes. Additionally, there is a continuing need for high reacting neutral species generation by microwave energy sources at or during low temperature (<500° C.) film depositions in CVD processing chambers and/or ALD processing chambers. Microwave plasma generated radicals are neutral, and chalcogens thermally crake to high concentrations of reacting species, such as S2, S4, Se2, etc. at low temperatures, unlike conventional plasma energy sources, which generate ion species which create defective 2D material film.

Two-dimensional (2D) materials, such as graphene, are a class of materials with a layered structure which leads to strong anisotropy in their electrical, chemical, mechanical, and thermal properties. The 2D transition metal dichalcogenides, with general formula MX2, generally maintain versatile properties. To illustrate, mono-layer or few-layered transition metal dichalcogenides are direct-gap semiconductors whose band gap energy, as well as carrier type (n-type or p-type), vary depending on the transition metals, chalcogens, dopants, composition and structure of the 2D film. Thus, what are needed in the art are improved apparatus and methods for material deposition.

SUMMARY

Embodiments described herein generally relate to a semiconductor processing platform. In one embodiment, an apparatus for processing a substrate is provided. The apparatus may include a platform configured to support a plurality of processing chambers. A first chamber may be coupled to the platform and the first chamber may be configured to perform an annealing process over a first surface of the substrate. A second chamber may also be coupled to the platform and the second chamber may be configured to deposit a chalcogenide film over the first surface of the substrate. A third chamber may also be coupled to the platform and the third chamber may be configured to deposit a dielectric material over the chalcogenide film. A fourth chamber may also be coupled to the platform and the fourth chamber configured to deposit a hardmask over the dielectric material. Furthermore, a fifth chamber may be coupled to the platform and the fifth chamber may be configured to etch at least a portion of the hardmask and the dielectric material. A sixth chamber may also be coupled to the platform and the sixth chamber may be configured to deposit a first metal material over the hardmask. Additionally, a seventh chamber may be coupled to the platform and the seventh chamber may be configured to deposit a second metal material over the first metal material.

In another embodiment, an apparatus for processing a substrate is disclosed. The apparatus may include a platform configured to support a plurality of chambers. The platform may include an annealing chamber coupled to the platform, a chalcogenide film deposition chamber coupled to the platform, and a high K film deposition chamber coupled to the platform. The platform may also include an etch chamber coupled to the platform, a first metal film deposition chamber coupled to the platform, and a second metal film deposition chamber coupled to the platform.

In yet another embodiment, a method for synthesizing and depositing a two-dimensional film material onto a substrate is disclosed. The method may include performing a first process within a first processing chamber to deposit a thermal oxide layer on a surface of the substrate, and performing a second process within a second processing chamber to deposit a hafnium oxide layer on the thermal oxide layer. The method may also include performing a third process within a third processing chamber to deposit an ammonium sulfide layer on the hafnium oxide layer, and performing a fourth process within a fourth processing chamber to deposit a hardmask on the thermal oxide layer. The method may further include performing a fifth process within a fifth processing chamber to etch at least a portion of the hardmask, and performing a sixth process within a sixth processing chamber to deposit a first metal material film on the hardmask. The method may additionally include performing a seventh process within a seventh processing chamber to deposit a second metal material film on the first metal material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a remote plasma system utilizing a microwave source. Additionally, generation and deposition techniques for 2D transition metal chalcogenides with large area uniformity utilizing microwave assisted generation of radicals are disclosed. Plasma may be generated remotely utilizing the microwave source.

A "two-dimensional" material as described herein refers to a deposited material having a thickness less than 1.0 nanometer.

A "substrate surface" as described herein refers to any substrate surface upon which film processing is performed. Exemplary materials of a substrate surface may include silicon, silicon oxide, doped silicon, germanium, gallium arsenide, glass, sapphire, and any other materials, depending on the application. A substrate surface may also include dielectric materials such as silicon dioxide and carbon doped silicon oxides.

A processing system for depositing and forming material on a substrate may contain at least one deposition chamber, such as a CVD chamber, and at least one annealing chamber. Other chambers may include, for example, physical vapor deposition (PVD) chambers, atomic layer deposition chambers (ALD), and pre-clean chambers. In one embodiment, a metal material is deposited on a silicon containing material, an optional metal nitride barrier layer may be deposited, and a metallic contact material is deposited on the substrate. The substrate may be exposed to at least one annealing process prior to, during, and/or subsequently to any of the deposition processes to form a metal silicide layer. In one embodiment, a bulk molybdenum sulfide layer is deposited on the substrate material, and a metal contact material is deposited on the substrate. The substrate may be exposed to at least one annealing process prior to, during, and/or subsequently to any of the deposition processes to form a metal silicide layer.

Figure 1:
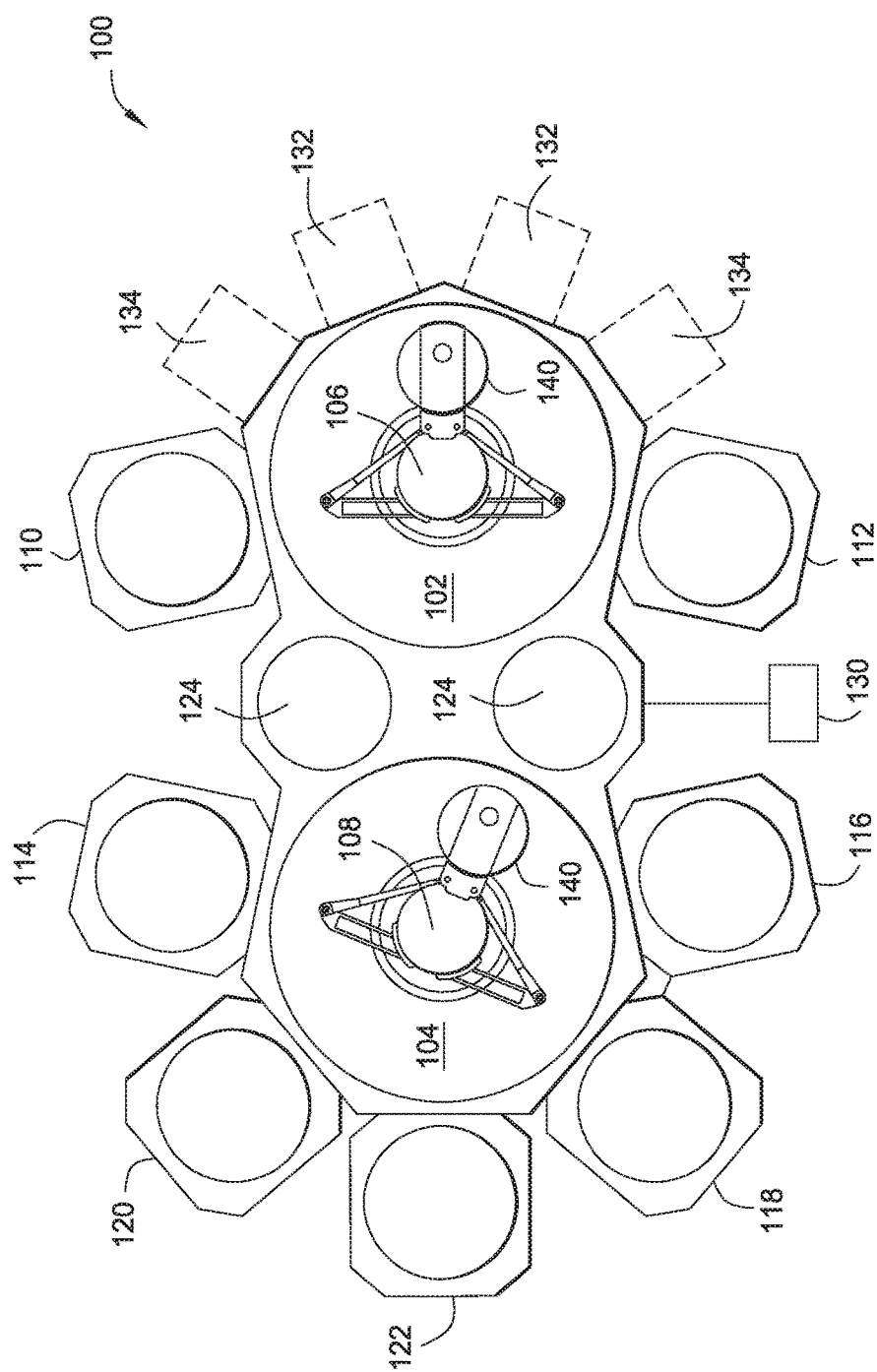
FIG. 1 illustrates a schematic plan view of an integrated multi-chamber platform, according to one embodiment described herein.

FIG. 1 depicts an integrated multi-chamber substrate processing system suitable for performing at least one embodiment of the deposition and annealing processes described herein. The deposition and annealing processes may be performed in a multi-chamber processing system or cluster tool having at least one PVD and/or CVD chamber and at least one annealing chamber disposed thereon. A processing platform that may be used during processes described herein is the ENDURA® processing platform commercially available from Applied Materials, Inc., located in Santa Clara, Calif. Other systems from other manufacturers may also be used to perform the processes described herein.

FIG. 1 is a schematic plan view of one embodiment of a processing platform system 100 including two transfer chambers 102, 104, transfer robots 106, 108 disposed within transfer chambers 102, 104 respectively, and a plurality of processing chambers 110, 112, 114, 116, 118, 120, 122 disposed on the processing platform system 100 adjacent the two transfer chambers 102, 104. The first transfer chamber 102 and the second transfer chamber 104 are separated by pass-through chambers 124. The pass-through chambers 124 may contain cool down or pre-heating chambers. Pass-through chambers 124 also may be pumped down or ventilated during substrate handling when the first transfer chamber 102 and the second transfer chamber 104 operate at different pressures. For example, the first transfer chamber 102 may operate at a pressure within a range from about 100 milliTorr to about 5 Torr, such as about 400 milliTorr, and the second transfer chamber 104 may operate at a pressure within a range from about $1 \times 10^{-5}$ Torr to about $1 \times 10^{-8}$ Torr, such as about $1 \times 10^{-7}$ Torr. Processing platform system 100 may be automated by programming a microprocessor controller 130.

The first transfer chamber 102 may be coupled with the processing platform system 100, chamber 110, such as an annealing chamber, chamber 112, such as a CVD chamber for depositing metal materials, and the pass through chambers 124. The first transfer chamber 102 may be configured to maintain a vacuum environment during transfer of the substrate between each of the chambers coupled with the processing platform system 100. Optionally, the first transfer chamber 102 may be coupled with a load lock chamber 132 (shown in phantom), and/or a degas chamber 134 (shown in phantom). In another example, the annealing chamber may be located on a separate platform, for example the VANTAGE® processing platform commercially available from Applied Materials, Inc., located in Santa Clara, Calif. Substrates 140 may be loaded into the processing platform system 100 though the load lock chamber 132. Thereafter, the substrates may be sequentially degased and cleaned in the degas chamber 134 and in an optional pre-clean chamber (not shown). The transfer robot 106 may move the substrate 140 between the various chambers.

The second transfer chamber 104 may be coupled to a cluster of processing chambers 114, 116, 118, 120, 122. The second transfer chamber 104 may be configured to maintain a vacuum environment during transfer of the substrate between each of the chambers coupled with the processing platform system 100. In one example, chamber 114 may be a CVD chamber, such as a dielectric deposition chamber for depositing a dielectric layer. In one embodiment, the dielectric layer may comprise a silicon dioxide material and/or a hafnium oxide material. In another example, the CVD chamber may be located on a separate processing platform, for example the CENTURA® processing platform commercially available from Applied Materials, Inc., located in Santa Clara, Calif. In another example, chamber 116 may be processing chamber for depositing a hardmask on the substrate. In another example, chambers 118, 122 may be PVD chambers or CVD chambers for depositing materials, such as metal materials. An example of suitable PVD chambers includes Self Ionized Plasma (SIP) and Advanced Low Pressure Source (ALPS®) chambers, commercially available from Applied Materials, Inc., located in Santa Clara, Calif. Chamber 120 may be a plasma etch chamber for etching the substrate surface and/or hardmask to remove unreacted metal after PVD metal deposition and/or annealing of the deposited material. The PVD processed substrates may be moved from transfer chamber 102 into transfer chamber 104 via pass-through chambers 124. Thereafter, transfer robot 108 may move the substrates between one or more of the processing chambers 114, 116, 118, 120, 122 for material deposition.

Additional annealing chambers such as Rapid Thermal Annealing (RTA) and/or diffusionless annealing chambers may also be disposed on the first transfer chamber 102 of the processing platform system 100. The additional chambers may provide post deposition annealing processes prior to substrate removal from the processing platform 100, transfer to the second transfer chamber 104, or transfer from the second transfer chamber 104 to the first transfer chamber 102.

While not shown, a plurality of vacuum pumps may be disposed in fluid communication with each transfer chamber and each of the processing chambers to independently regulate pressures in the respective chambers. The pumps may establish a vacuum gradient of increasing pressure across the apparatus from the load lock chamber to the processing chambers.

Referring to FIG. 1, the processing chambers 110, 112, 114, 116, 118, 120, 122 may each be controlled by a microprocessor controller 130. The microprocessor controller 130 may be one of any form of general purpose computer processor (CPU) that can be used in an industrial setting for controlling processing chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Software routines as necessary may be stored in the memory or executed by a second CPU that is remotely located.

Software routines are executed to initiate process recipes or sequences. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software and hardware.

The substrate may comprise a single silicon material. In one embodiment the substrate may comprise a silicon (Si) material and/or a silicon dioxide ($SiO_2$) material. Referring to FIG. 1, a substrate may be moved through the processing platform system 100 in a predetermined order. The substrate may be directed to and disposed within a first processing chamber 110. Processing chamber 110 may be an anneal chamber designed to prepare a surface of the substrate to receive a metal material layer. The annealing may be a diffusionless annealing process. The diffusionless annealing process may refer to an annealing process that limits or prevents diffusion of dopants into surrounding layers, but maintains a desired dopant profile within desired regions of the semiconductor layer.

Diffusionless annealing processes may have a short dwell time, for example less than 10 milliseconds, which may minimize the diffusion of the dopants into surrounding layers. Diffusionless annealing processes may include laser annealing processes, such as millisecond annealing processes, nanosecond annealing processes, and microsecond annealing processes, and flash lamp annealing processes including xenon flash lamp annealing processes. Processing chamber 110 may be configured to perform an annealing process over a first surface of the substrate. Processing chamber 110 may be coupled to the processing platform system 100.

Processing chamber 112 may be a CVD processing chamber, and may be configured to deposit a 2D film material over the first surface of the substrate. 2D materials may include, but are not limited to, for example Graphene, Boron Nitride (BN), and/or transition metal dichalcogenides. The 2D materials may have free charges that are immobile in one-spatial dimension and mobile in another. 2D materials may exhibit various properties, such as high mechanical strength, elasticity, electrical conductivity, electron mobility, radiation absorption, mechanical flexibility, high optical transmittance, and light weight. Atomically thin 2D materials may be metallic, semi-metallic, semiconductor, and/or superconductor materials. By way of example only, a monolayer of $MoS_2$ exhibits a direct intrinsic bandgap (approximately 1.8 eV), acceptable mobility for transistor operation (approximately about 200 $cm^2$ $V^{-1}$ $s^{-1}$), and quantum confinement. Furthermore, atomically thin 2D materials may be doped (both n- and p-type).

The processing chamber 112 may deposit a chalcogenide film over the first surface of the substrate. The chalcogenide film may comprise a metal chalcogenide material. The metal chalcogenide material may comprise molybdenum hexacarbonyl, molybdenum (V) chloride, tungsten hexachloride ($TiCl_6$), tungsten hexacarbonyl, ammonium tetrathiomolybdate, sulfur, selenium, hydrogen sulfide, a thioether material, phosphine, ammonia, chlorine, dichloromethane, and/or mixtures and combinations thereof. Processing chamber 112 may be coupled to the processing platform system 100.

Figure 2:
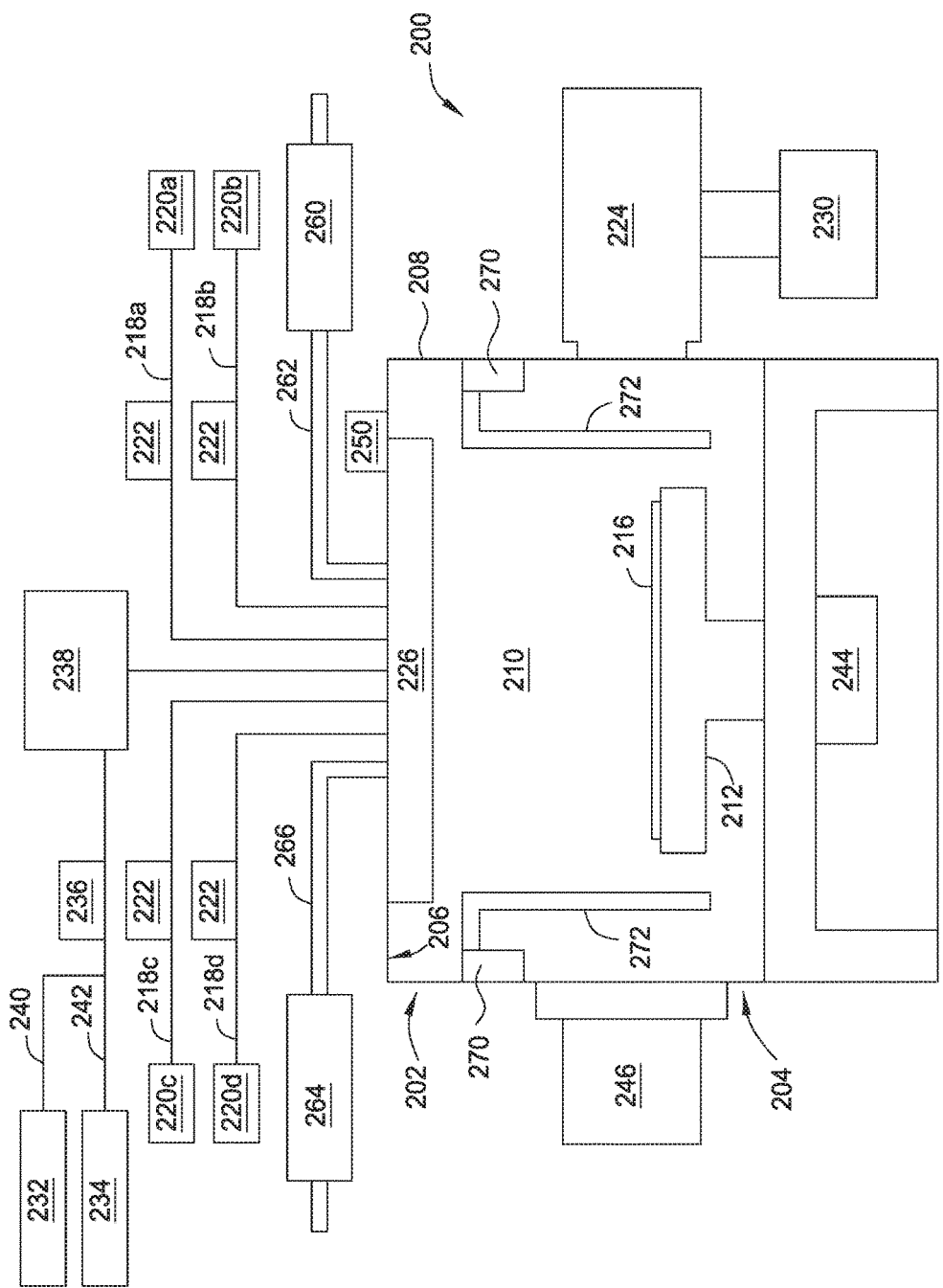
FIG. 2 illustrates a schematic cross-sectional view of a processing chamber within the integrated multi-chamber platform of FIG. 1, according to one embodiment described herein.

FIG. 2 is a schematic cross-sectional view of a deposition chamber 200 according to one embodiment. Deposition chamber 200 may be suitable for use as processing chamber 112 as illustrated in FIG. 1. A remote plasma source 238 may be coupled to the deposition chamber 200. In some embodiments, the remote plasma source 238 may be a microwave source. Transition metal precursors and/or chalcogens in gas phase may pass through the remote plasma source 238 before entering into shower head of the deposition chamber 200, which in some embodiments may be a CVD chamber or an ALD chamber. Deposition chamber 200 may be suitable for sputter depositing materials according to one embodiment described herein. Deposition chamber 200 may be utilized to deposit the 2D film material over the first surface of the substrate. The 2D film material may be a 2D crystalline material. In certain embodiments, deposition chamber 200 may be configured to manufacture transistors comprising transitional chalcogenide materials.

The deposition chamber 200 has an upper sidewall 202, a lower sidewall 204, and a lid portion 206 defining a body 208 that encloses an interior volume 210. A substrate support 212, such as a pedestal, may be disposed in the interior volume 210 of the deposition chamber 200. Heat shields 270, 272 may be disposed within the interior volume 210 and surround the substrate support 212.

In one embodiment, the deposition chamber 200 comprises a CVD chamber capable of depositing, for example, nickel, titanium, gold, selenium, molybdenum hexacarbonyl, molybdenum (V) chloride, ammonium tetrathiomolybdate, sulfur, selenium, hydrogen sulfide, a thioether material, phosphine, ammonia, chlorine, dichloromethane, and/or mixtures and combinations thereof, on the substrate 216.

Gas lines 218a, 218b, 218c, 218d may be coupled to a gas source 220a, 220b, 220c, 220d and the deposition chamber 200 to supply process gases into the interior volume 210. In one embodiment, process gases may include inert gases, non-reactive gases, and reactive gases if necessary. Examples of process gases that may be provided by the gas source 218a, 218b, 218c, 218d include, but are not limited to, argon gas (Ar), helium gas (He), neon gas (Ne), nitrogen gas ($N_2$), oxygen gas ($O_2$), and hydrogen ($H_2$), among others. In one embodiment, gas line 218a may deliver argon and/or nitrogen into the interior volume 210. In one embodiment, gas line 218b may deliver a first dopant into the interior volume 210. In one embodiment, gas line 218c may deliver hydrogen into the interior volume 210. In one embodiment, gas line 218d may deliver a second dopant into the interior volume 210. Each gas line 218a, 218b, 218c, 218d may be a heated gas line. Each gas line 218a, 218b, 218c, 218d may be controlled by a mass flow controller 222 individually coupled with each gas line 218a, 218b, 218c, 218d to regulate the flow of gas therethrough. Additionally, gas lines 226, 228 may be coupled to the deposition chamber 200. Gas lines 226, 228 may be configured to deliver precursor gases into deposition chamber 200.

A first carrier gas, for example argon, may also be delivered into the interior volume 210 via a first precursor 260 and through a first gas line 262. A second carrier gas, for example argon, may further be delivered into the interior volume 210 via a second precursor 264 and through a second gas line 266.

A pumping device 224 may be coupled to the deposition chamber 200 in communication with the interior volume 210 to control the pressure of the interior volume 210. The pumping device 224 may further be coupled with an abatement system 230. The lid portion 206 may support a shower head assembly 226 for mixing gases therein.

Etchant materials, for example $NF_3$, may be delivered from an etchant supply 232 to the interior volume 210 of the deposition chamber 200 via an etchant supply line 240. Furthermore, precursor materials may be delivered from a precursor supply 234 to the interior volume 210 of the deposition chamber 200 via a precursor supply line 242. The etchant supply line 240 and the precursor supply line 242 may be regulated by a valve 236. The etchant material and the precursor material may enter a remote plasma source 238, such as a microwave source, outside of the deposition chamber 200 prior to entering the deposition chamber 200. The remote plasma source 238 may generate and form the plasma outside of the deposition chamber 200 utilizing a microwave source. The use of the remote plasma source 238 may generate predominantly $S_2$ radicals by thermal dissociation of $S_8$ molecules.

Additionally, an electrical feed through 244 may be coupled to the deposition chamber 200. The electrical feed through 244 may be located below the interior volume 210 of the deposition chamber 200. A gauge plate 246 may be coupled to the deposition chamber 200 and located on the exterior of the upper sidewall 202 of the deposition chamber 200.

A controller may 250 may be coupled with the process chamber 200. The controller 250 may include a central processing unit (CPU) (not shown), a memory (not shown), and support circuits (not shown). The controller 250 may be utilized to control the process sequence, regulating the gas flows from the gas sources 220a, 220b, 220c, 220d into the deposition chamber 200 and controlling ion bombardment. The CPU may be of any form of a general purpose computer processor that can be used in an industrial setting. The software routines can be stored in the memory, such as a random access memory, a read only memory, floppy or hard disk drive, or other form of digital storage. The support circuits may be conventionally coupled to the CPU and may comprise cache, clock circuits, input/output subsystems, power supplies, and the like. The software routines, when executed by the CPU, transform the CPU into a specific purpose computer (controller) 250 that controls the deposition chamber 200 such that the processes are performed in accordance with the present disclosure. The software routines may also be stored and/or executed by a second controller (not shown) that is located remotely from the processing chamber 200.

During processing, material may be deposited on the surface of the substrate 216. Gases may exit the shower head assembly 226 and enter the interior volume 210 to deposit on the substrate 216.

Referring again to FIG. 1, processing chamber 114 may be a dielectric deposition chamber configured to deposit a dielectric material over the chalcogenide film. In one embodiment, the dielectric material may be a silicon dioxide ($SiO_2$) material. In some embodiments, the dielectric material may be a high-κ dielectric material. The high-κ dielectric material may be a hafnium based high-κ dielectric material, such as, for example, a nitrided hafnium silicate. In another embodiment the high-κ dielectric material may be a hafnium oxide ($HfO_2$) material or a hafnium silicate material (HfSiO). The dielectric material may be utilized as a gate dielectric. The utilization of the high-κ dielectric material may allow for increased gate capacitance with reduced or without current leakage. In some embodiments, "high-κ" dielectric materials may include materials having a high dielectric constant κ, where κ is in a range of between about 20 and about 100. Furthermore, processing chamber 114 may be coupled to the processing platform system 100.

Processing chamber 116 may be a hardmask deposition chamber. Processing chamber 116 may be configured to deposit a hardmask over the dielectric material. The hardmask may be utilized for patterning the substrate, the hardmask, and/or material layers located between the hardmask and the substrate. Processing chamber 116 may be coupled to the processing platform system 100.

Processing chamber 118 may be an etch chamber and may be configured to etch at least a portion of the hardmask and the dielectric material. The etch process may remove desired amounts of the hardmask, the dielectric layer, and/or other material layers from the surface of the substrate to form structures thereon. Processing chamber 118 may be coupled to the processing platform system 100.

Processing chamber 120 may be a 2D film deposition chamber. The 2D deposition system may allow for the formation of a transition metal chalcogenide. Processing chamber 120 may be configured to deposit a source and/or a drain. As such, processing chamber 120 may deposit a first metal material over the hardmask. The first metal material may comprise nickel, titanium, gold, and/or combinations and mixtures thereof. Processing chamber 120 may be coupled to the processing platform system 100.

Processing chamber 122 may be an additional, or second, 2D film deposition chamber. Processing chamber 120 may be configured to deposit a second metal material over the first metal material. The second metal material may comprise selenium or a selenium containing material. The second metal material may be a top gate material of the substrate. Processing chamber 122 may be coupled to the processing platform system 100.

Figure 3:
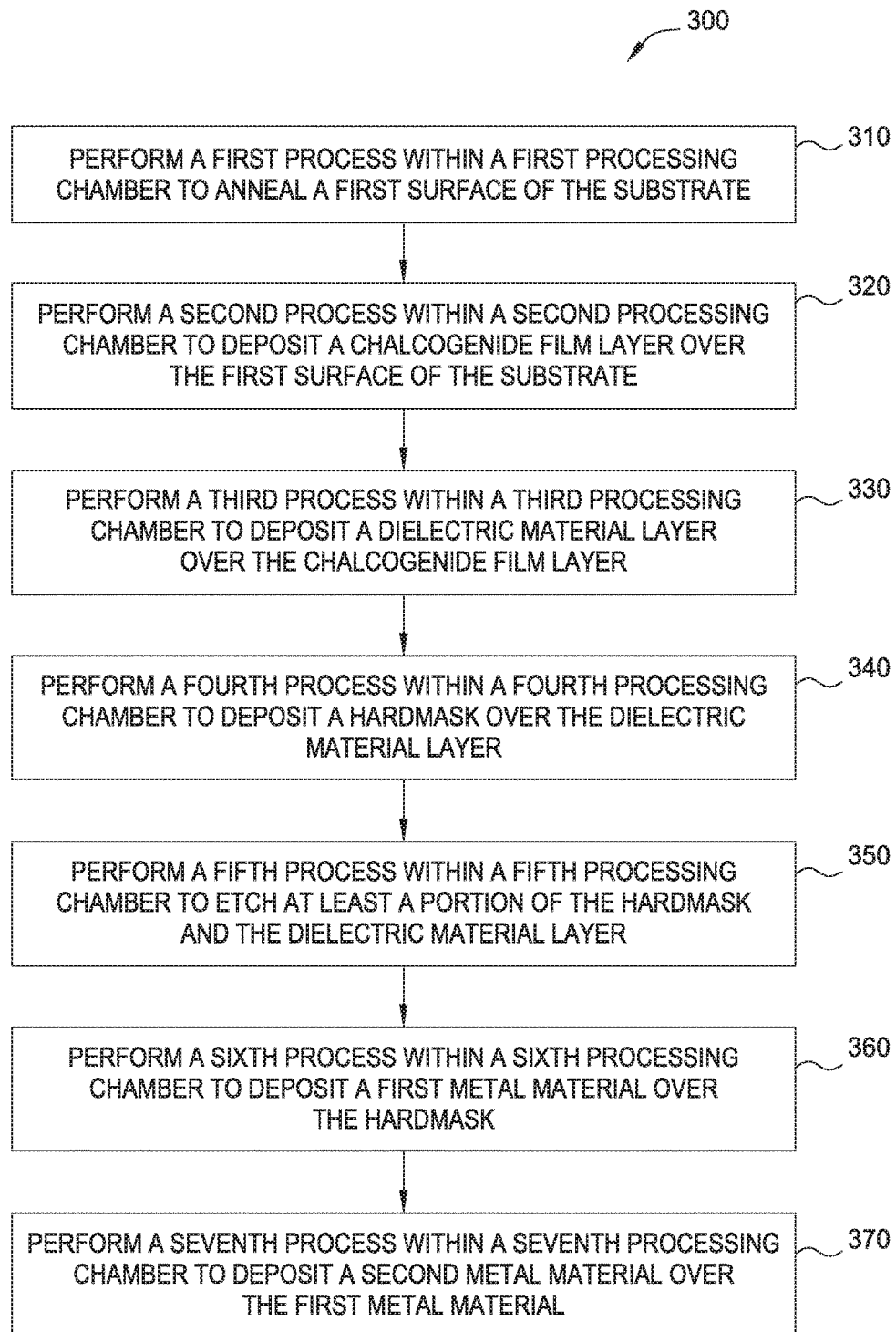
FIG. 3 illustrates a flow diagram of a method for synthesizing and depositing a two-dimensional film material onto a substrate, according to one embodiment described herein.

FIG. 3 illustrates a flow diagram 300 of a method for synthesizing and depositing a two-dimensional film material onto a substrate. Flow diagram 300 begins at operation 310, in which a first process is performed within a first processing chamber, such as processing chamber 110. The first process may anneal a first surface of the substrate. The anneal chamber may be designed to anneal the substrate in order to prepare a surface of the substrate to receive a metal material layer. The annealing may be a diffusionless annealing process. Diffusionless annealing processes may include laser annealing processes, such as millisecond annealing processes, nanosecond annealing processes, microsecond annealing processes, and flash lamp annealing processes. In one embodiment, a flash lamp annealing process may include xenon flash lamp annealing processes.

At operation 320, a second process may be performed within a second processing chamber, such as processing chamber 112. The second process may deposit a chalcogenide film layer over the first surface of the substrate. The second processing chamber may be a CVD processing chamber which may be configured to deposit a 2D film material over the first surface of the substrate. The chalcogenide film may comprise a metal chalcogenide material. The metal chalcogenide material may comprise molybdenum hexacarbonyl, molybdenum (V) chloride, ammonium tetrathiomolybdate, sulfur, selenium, hydrogen sulfide, a thioether material, phosphine, ammonia, chlorine, dichloromethane, and/or mixtures and combinations thereof.

At operation 330, a third process may be performed within a third processing chamber, such as processing chamber 114. The third process may deposit a dielectric material layer over the chalcogenide film layer. The third processing chamber may be a dielectric deposition chamber configured to deposit the dielectric material over the chalcogenide film. In one embodiment, the dielectric material may be a silicon dioxide ($SiO_2$) material. In some embodiments, the dielectric material may be a high-κ dielectric material, such as, a nitrided hafnium silicate. In another embodiment the high-κ dielectric material may be a hafnium oxide ($HfO_2$) material or a hafnium silicate material (HfSiO).

At operation 340, a fourth process may be performed within a fourth processing chamber, such as processing chamber 116. The fourth process may deposit a hardmask over the dielectric material layer. The fourth processing chamber may be configured to deposit the hardmask over the dielectric material.

At operation 350, a fifth process may be performed within a fifth processing chamber, such as processing chamber 118. The fifth process may etch at least a portion of the hardmask and the dielectric material layer. The fifth processing chamber may be configured to etch at least a portion of the hardmask and the dielectric material. The etch process may remove desired amounts of the hardmask, the dielectric layer, and/or other material layers from the surface of the substrate to form structures thereon.

At operation 360, a sixth process may be performed within a sixth processing chamber, such as processing chamber 120. The sixth process may deposit a first metal material over the hardmask. The sixth processing chamber may be a 2D film deposition chamber configured to deposit a source and/or a drain. As such, processing chamber 120 may deposit a first metal material over the hardmask. The first metal material may comprise nickel, titanium, gold, and/or combinations and mixtures thereof.

At operation 370, a seventh process may be performed within a seventh processing chamber, such as processing chamber 122. The seventh process may deposit a second metal material over the first metal material. The seventh processing chamber may be an additional 2D film deposition chamber configured to deposit a second metal material over the first metal material. The second metal material may comprise selenium or a selenium containing material.

Additional advantages of the disclosure include in-situ annealing, which may be performed under vacuum such that the substrate is not exposed to atmosphere. Furthermore, annealing may also be performed in an inert controlled environment. Also, the substrate temperature may range from about room temperature to approximately about 600 degrees Celsius. Such temperatures may assist deposition, annealing, and purging cycles. Additional advantages of the disclosure include processing chamber cleaning which may be completed utilizing the integrated remote plasma source (e.g. remote microwave source). Chamber cleaning may also be completed utilizing a reactive gas plasma generator source.

Embodiments described herein provide a remote plasma system utilizing a microwave source. Additionally, generation and deposition techniques for 2D transition metal chalcogenides with large area uniformity utilizing microwave assisted generation of radicals is disclosed. Plasma may be generated remotely utilizing the microwave source.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the scope of these teachings.

What is claimed is:

1. An apparatus for processing a substrate, comprising:
   a platform configured to support a plurality of processing chambers;
   a first processing chamber coupled to the platform, the first processing chamber configured to perform an annealing process over a first surface of the substrate;
   a second processing chamber coupled to the platform, the second processing chamber configured to deposit a chalcogenide film over the first surface of the substrate;
   a third processing chamber coupled to the platform, the third processing chamber configured to deposit a dielectric material over the chalcogenide film;
   a fourth processing chamber coupled to the platform, the fourth processing chamber configured to deposit a hardmask over the dielectric material;
   a fifth processing chamber coupled to the platform, the fifth processing chamber configured to etch at least a portion of the hardmask and the dielectric material;
   a sixth processing chamber coupled to the platform, the sixth processing chamber configured to deposit a first metal material over the hardmask; and
   a seventh processing chamber coupled to the platform, the seventh processing chamber configured to deposit a second metal material over the first metal material.

2. The apparatus of claim 1, wherein the first metal material comprises nickel, titanium, gold, or combinations and mixtures thereof.

3. The apparatus of claim 1, wherein the second metal material comprises selenium.

4. The apparatus of claim 1, wherein the dielectric material is a silicon dioxide ($SiO_2$) material or a hafnium oxide ($HfO_2$) material.

5. The apparatus of claim 1, further comprising:
a transfer chamber coupled to the platform, the transfer chamber configured to maintain a vacuum environment during transfer of the substrate between each of the processing chambers.

6. The apparatus of claim 1, wherein the chalcogenide film comprises a metal chalcogenide material.

7. The apparatus of claim 6, wherein the metal chalcogenide material comprises molybdenum hexacarbonyl, molybdenum (V) chloride, tungsten hexachloride ($TiCl_6$), tungsten hexacarbonyl, ammonium tetrathiomolybdate, sulfur, selenium, hydrogen sulfide, a thioether material, phosphine, ammonia, chlorine, dichloromethane, or mixtures and combinations thereof.

8. The apparatus of claim 1, wherein the substrate comprises a single silicon material.

9. An apparatus for processing a substrate, comprising:
a platform configured to support a plurality of chambers, the chambers comprising:
an annealing chamber coupled to the platform;
a chalcogenide film deposition chamber coupled to the platform;
a high K film deposition chamber coupled to the platform;
an etch chamber coupled to the platform;
a first metal film deposition chamber coupled to the platform; and
a second metal film deposition chamber coupled to the platform.

10. The apparatus of claim 9, wherein the first metal film deposition chamber deposits nickel, titanium, gold, or combinations and mixtures thereof.

11. The apparatus of claim 9, wherein the second metal film deposition chamber deposits selenium.

12. The apparatus of claim 9, wherein the chalcogenide film deposition chamber deposits a metal chalcogenide film over the substrate.

13. The apparatus of claim 12, wherein the metal chalcogenide film comprises molybdenum hexacarbonyl, molybdenum (V) chloride, tungsten hexachloride ($TiCl_6$), tungsten hexacarbonyl, ammonium tetrathiomolybdate, sulfur, selenium, hydrogen sulfide, a thioether material, phosphine, ammonia, chlorine, or dichloromethane.

14. The apparatus of claim 12, further comprising:
a dielectric material deposition chamber, configured to deposit a dielectric material over the metal chalcogenide film; and
a hardmask deposition chamber, configured to deposit a hardmask over at least a portion of the dielectric material.

15. The apparatus of claim 9, further comprising:
a transfer chamber coupled to the platform, the transfer chamber configured to maintain a vacuum environment during transfer of the substrate between each of the chambers.

16. The apparatus of claim 9, wherein the substrate comprises a single silicon material.

17. A method for synthesizing and depositing a two-dimensional film material onto a substrate, comprising:
performing a first process within a first processing chamber to anneal a first surface of the substrate;
performing a second process within a second processing chamber to deposit a chalcogenide film layer over the first surface of the substrate;
performing a third process within a third processing chamber to deposit a dielectric material layer over the chalcogenide film layer;
performing a fourth process within a fourth processing chamber to deposit a hardmask over the dielectric material layer;
performing a fifth process within a fifth processing chamber to etch at least a portion of the hardmask and the dielectric material layer;
performing a sixth process within a sixth processing chamber to deposit a first metal material over the hardmask; and
performing a seventh process within a seventh processing chamber to deposit a second metal material over the first metal material.

18. The method of claim 17, wherein the first metal material and the second metal material form an interconnected layer.

19. The method of claim 17, further comprising:
performing an annealing process to form a metal layer on the substrate.

20. The method of claim 17, wherein the two dimensional film material is a chalcogenide film material having a thickness less than 1 nanometer.

* * * * *